United States Patent [19]

Spater et al.

[11] Patent Number: 4,697,061
[45] Date of Patent: Sep. 29, 1987

[54] METHOD FOR WELDING BY MEANS OF LASER LIGHT

[75] Inventors: Lothar Spater, Annweiler; Herbert Prussas, Reichertshausen, both of Fed. Rep. of Germany

[73] Assignee: Siemens Aktiengesellschaft, Berlin and Munich, Fed. Rep. of Germany

[21] Appl. No.: 901,657

[22] Filed: Aug. 29, 1986

[30] Foreign Application Priority Data

Sep. 19, 1985 [DE] Fed. Rep. of Germany ....... 3533468

[51] Int. Cl.$^4$ ............................................. B23K 26/00
[52] U.S. Cl. ............................... 219/121 LD; 219/118
[58] Field of Search ... 219/121 LCl121 LD, 121 LC, 219/121 ED, 118, 85 F

[56] References Cited

U.S. PATENT DOCUMENTS

| 4,023,005 | 5/1977 | Bolin | 219/121 LM |
| 4,341,942 | 7/1982 | Chaudhari et al. | 219/121 LC |

FOREIGN PATENT DOCUMENTS

| 58-110172 | 6/1983 | Japan | |
| 118398 | 6/1985 | Japan | 219/121 LD |
| WO83/00112 | 8/1984 | PCT Int'l Appl. | |
| 0593757 | 11/1975 | Switzerland | 219/121 LD |

OTHER PUBLICATIONS

Laser and Electro Ektro–Optical PTIK, vol. 7, No. 3, Sep., 1975.
Feinwerktechnik Und Messtechnik, vol. 90, No. 5, Jul.–Aug., 1982.

*Primary Examiner*—C. L. Albritton
*Attorney, Agent, or Firm*—Hill, Van Santen, Steadman & Simpson

[57] ABSTRACT

A method for laser-light welding of a metallic base layer to a thin, metallic covering lying thereon, whereby the covering which is highly reflective for the laser light is covered with a metal skin which is less highly reflective for the laser light, namely with a metal skin which noticeably absorbs the laser light. In case both the covering as well as the base layer are wettable with solder metal, the covering highly reflective for the laser light is first covered with a metal skin composed of a solder metal, whereupon said covering is welded to the base layer by means of the laser light.

5 Claims, 4 Drawing Figures

METHOD FOR WELDING BY MEANS OF LASER LIGHT

BACKGROUND OF THE INVENTION

1. Field of the Invention

The present invention relates to a special application of laser light, more specifically for using laser light to weld a metallic base layer to a thin metallic covering lying thereon.

2. Description of the Prior Art

U.S. Pat. No. 4,023,005 discloses a method of welding a metallic base layer to a thin metallic covering wherein the metallic covering is composed of copper, silver or gold, whereby the covering which highly reflects the laser light is additionally coated with a metal skin of nickel or palladium which absorbs the laser light to a relatively high degree, namely in order to enable a welding by means of laser light with low energy outlay even when the metal of the covering would greatly reflect the laser light in and of itself.

SUMMARY OF THE INVENTION

An object of the invention is to cover the covering with a metal skin which is easier to apply than nickel or palladium and which is composed of an inexpensive metal, which is easily manipulatable everywhere and is usually available already in great quantities in the appertaining workshops. Moreover, the invention should enable that, in addition to the welding, a soldering of the base layer covering to the side of the weld location can also be achieved, so that the strength of the connection between the covering and the base layer is higher than that with only welding without additional soldering.

Additional advantages may be achieved by the invention including: allowing pure copper and/or alloys having a high copper content which are especially highly reflective for laser light to be welded, and also allowing a certain anti-corrosion protection of these copper-containing parts, particularly of the weld location as well, to be achieved by means of the solder metal skin; allowing a well-adhereing soldering to the side of the weld location to be achieved with high reliability and, thus, allowing a particularly high strength of the connection between the base layer and the covering to be achieved with high reliability; allowing the base layer for the welding to be prepared on the carrier which is unsuitable in and of itself for direct welding to the covering; allowing a particularly small number of different materials to be required for fastening the covering to a solderable but non-weldable carrier; and allowing the advantages of the invention to be exploited for the manufacture of a specific final product.

BRIEF DESCRIPTION OF THE DRAWINGS

The invention shall be set forth in greater detail with reference to embodiments of the invention shown in the figures, whereby.

DESCRIPTION OF THE PREFERRED EMBODIMENTS

Figure 1:
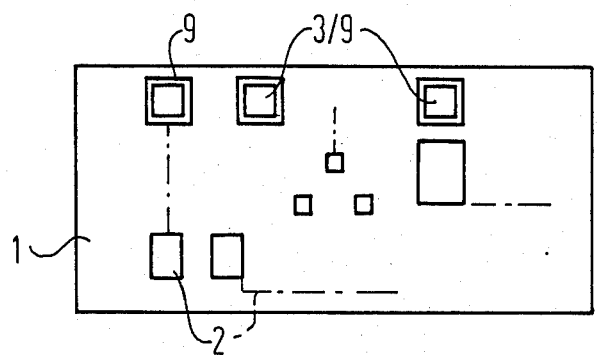
FIG. 1 shows a plan view of a ceramic thick film circuit carrier having a solder-attached lamina as a base layer.

All figures show details of a product manufactured in accord with the invention, namely of a ceramic circuit carrier 1 which is destined for an electronic communications systems, for example for an ISDN switching system. What is shown in the figures is the product in its various processing stages. A covering 4, i.e. a wire, a metal sheet, a spring clip or the like, to be welded onto a base layer 3 serves, for example, as an electrical terminal and/or as a heat dissipation member exhibiting good thermal conductivity.

Ceramic circuit carriers 1 having, for example, film circuits 2 are frequently integrated into hermetically sealed housing for large communication systems, for example, housings for opto-electronic transmission and reception modules. The film circuits must be electrically connected, for example, to terminal pins which proceed from discrete components in the housing, for example infrared diodes, or which are conducted through the housing.

Given an appropriate position of the terminal pins, such electrical connections can in fact frequently be produced with the assistance of devices for bonding wires. When, as a consequence of the technically required structure of the housing, however, the terminal pins lie in unfavorable positions relative to the circuit carrier 1 or when the covering 4, comprising small heat conducting bands of, for example, copper having a relatively large cross-section, must be connected to the circuit carrier 1 or to the components 2, then the application of the wire bonding method is not possible or is extremely involved. Column electrode welding also then requires certain prerequisites which cannot always be met. Such connections have therefore hitherto been soldered manually in a complicated way or have been pinched.

A particularly easily manipulatable possibility of producing particularly solid, both electrical as well as thermic connections between, for example, circuit parts and terminal pins in a simple, different way with little laser light energy is shown by the invention.

As a consequence of the high electrical and thermal conductivity, coverings 4 comprising small heat conducting bands of copper or of copper alloys are frequently employed. These, however, are relatively difficult to connect to their base layer with today's most widespread ND-YAG lasers. Moreover, the strength of the connection is not adequate in many instances. The particular reason for this is the reflection characteristic of copper in the infrared region which, depending on the surface quality of the copper, can differ greatly but which is usually far too high.

The invention solves the problem of how a covering 4—serving, for example, for electrical or thermic purposes, for example, a small heat-conducting band can be welded to the base layer 3 and, thus for example, to the ceramic carrier 1 even in mass production, being welded thereto in a special way which is still easily possible with little outlay, even in very small housings, given relatively unfavorable mutual positions of all solid weld locations to be produced. All electrical and thermic connections can be produced without much outlay in accordance with the present invention even in tight housings between locations at an arbitrary distance from one another. The base layer, thus, can be formed not only by the lamina 3 shown in the figures but, for example, can also be formed by a location of a metallic terminal pin in that housing.

Merely as an example for a welding of the invention, FIGS. 1 and 2 thus show a ceramic thick film circuit carrier on which extremely thin components 2 such as terminals and lines which, for example, are only a few $\mu$m thick are printed by means of a silk-screening method, these being composed, for example, of heat-treated conductive pastes which are subsequently cured. Such terminals 2 can frequently not be employed as base layer onto which a covering 4 is welded because, namely, the terminals 2 are partly too thin for this purpose and are partly too sensitive.

As shown in FIGS. 1 through 4, a metal foil was therefore first applied as a weldable base layer 3 for mass production of electrical and/or thermic terminals 2/3/4. The electrically and/or thermally conductive coverings 4 shown in FIGS. 3 and 4 should then be subsequently welded to this base layer 3. For that purpose, the covering 4 wettable with solder metal for example with tin, is first covered with a metal skin 5 composed of a solder metal i.e., for example, of the tin, which should reflect the laser light 7 as little as possible, whereupon the covering 4 was welded to the base layer 3 likewise wettable with this solder metal 5, being welded thereto at location 8 by means of the laser light 7.

Figure 3:
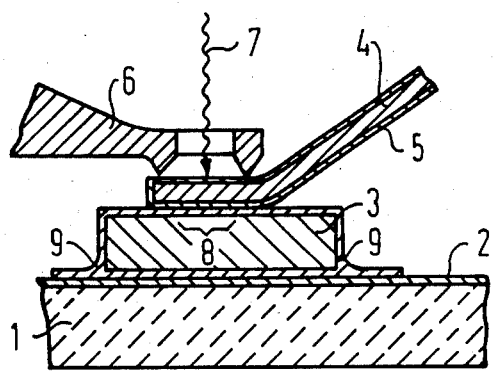
FIG. 3 shows a section through the weld location shortly before the welding.
Figure 4:
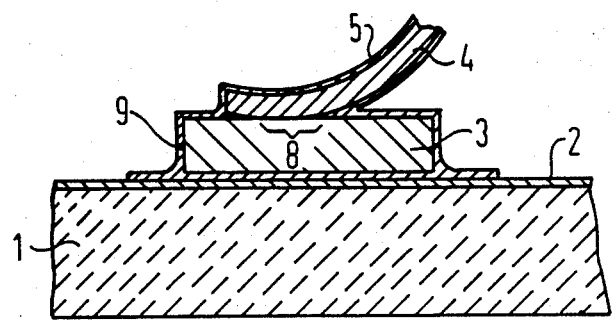
FIG. 4 shows a section through the weld location shortly after the welding.

Tests have shown that such a laser weld exhibits an especially high strength and constant quality when both parts 3, 4 to be connected which, for example, are composed of copper, have been previously tinplated, for example 2 through 6 $\mu$m thick, for example galvanically or by immersion, cf. the tin metal skins 5 and 9 in FIGS. 3 and 4. In trial welds of a base layer 3 of tin-plated copper having a covering 4 of tin-plated CuCoBe alloy, for example, about twice the strength compared to a weld without any tin-plating at all of the parts 3 and 4 was achieved with 30% less light energy 7 given conditions which were otherwise extremely favorable. The increased strength of the inventively produced weld also results because, during welding, the tin all around the weld location 8 also melts and an additional solder connection thus arises. In addition to the lower energy, better welding, the tin surface also produces a good protection against an oxide formation at the copper surface and on the CuCoBe surface. As a result, the parts 3, 4 can be stored and transported in air for a correspondingly longer time.

Figure 2:
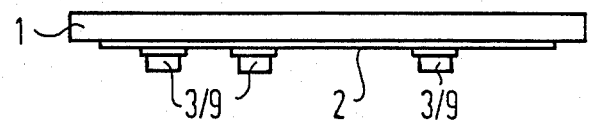
FIG. 2 shows a side view of the circuit carrier of FIG. 1.

In order to enable laser welds on film circuits having $\mu$m-thick layers 2 despite the low layer thickness and in order to exploit the inventively attainable advantages for the thermal and/or electrical connection of the parts 2, 3, 4, the circuit carrier 1 of FIG. 1 can be hybridized at the desired location 2 with a tin-plated lamina 3 of Cu3 or of a copper alloy 3, namely can be soldered, whereby this copper lamina 3 is, for example 200 $\mu$m thick, i.e. has a considerably greater thickness than the layers 2 which, for example, are 0.2 through 35. $\mu$m thick. The covering 4, for example a small thermally conductive band 4 which is provided with a solderable (tin) metal skin 5, is then placed onto the lamina 3, is then pressed against the lamina 3 with the assistance of, for example, an annular holding-down clamp/pressure member 6, is then so greatly heated punctiform by means of a laser burst 7 incident on the axis that, in accord with FIG. 4, the underside of the covering 4 is welded to the lamina 3 at location 8. The tin-platings 5, 9 of the covering 4 and of the lamina 3 thereby also fuse to one another and form a continuous protective layer 5/9 on all sides of the weld 8 which further increases the strength of the weld.

After the welded location 8 has hardened but before the melted solder metal 5 has hardened, the hold-down clamp 6 is lifted off so that the solder metal 5 also proceeds well to the contacting surface between the hold-down clamp 6 and the covering 4 and, thus, the soldered [connection]between the covering 4 and the lamina 3 is no longer torn or damaged when the hold-down clamp 6 is lifted off.

It can often be particularly favorable to solder the base layer 3 to a surface 2 of the carrier exhibiting adhesion for solder metal, being soldered thereto before welding to the covering 4, whereby this surface Z itself can be composed, for example, of a solder paste 2 printed by means of silkscreening. Such a manufacturing technique is extremely uniform in and of itself; namely, it requires especially few types of material and especially few types of technology in order to produce the desired electrical and/or thermal connections 3/4.

As is apparent from the foregoing specification, the invention is susceptible of being embodied with various alterations and modifications which may differ particularly from those that have been described in the preceding specification and description. It should be understood that we wish to embody within the scope of the patent warranted hereon all such modifications as reasonably and properly come within the scope of our contribution to the art.

We claim as our invention:

1. A method for laser light welding of a metallic base layer to a thin metallic covering lying thereon, whereby said covering which highly reflects said laser light is covered with a metal skin less highly reflective for said laser light, namely a metal skin which noticeably absorbs said laser light, comprising the steps of wetting both said covering as well as said base layer with a metal skin composed of a solder metal, and subsequently welding said covering to base layer by means of said laser light, wherein said covering utilized contains a high degree of copper which is first covered with said metal skin of solder metal and, subsequently thereto, said covering as welded to said base layer which likewise contains a high degree of copper and which is likewise covered with a metal skin of solder metal, being welded thereto by means of said laser light, wherein said base layer forms a lamina which has been attached as contact spots on a ceramic circuit carrier of an electronic switching system.

2. A method for laser light welding of a metallic base layer to a thin metallic covering lying thereon, whereby said covering which highly reflects said laser light is covered with a metal skin less highly reflective for said laser light, namely a metal skin which noticeably absorbs said laser light, comprising the steps of wetting both said covering as well as said base layer with a metal skin composed of a solder metal, and subsequently welding said covering to base layer by means of said laser light, wherein said covering utilized contains a high degree of copper which is first covered with said metal skin of solder metal and, subsequently thereto, said covering as welded to said base layer which likewise contains a high degree of copper and which is likewise covered with a metal skin of solder metal, being welded thereto by means of said laser light, wherein said base layer has been soldered to a surface of a carrier exhibiting adhesion for solder metal, having been soldered thereto before welding to said covering.

3. A method according to claim 2, wherein during welding, said covering is pressed against said base layer by means of a pressure member and said pressure member is in turn lifted off from said covering after the solidification of the welded location but before the solidification of the solder metal of the metal skin of the covering proximate to the pressure member.

4. A method of attaching a metallic base layer to a thin metallic covering comprising the steps:

separately covering said base layer and said covering with a metal skin of solder which has a low laser light reflectivity;

laying said covering over said base layer; and directing laser light onto said covering to weld said covering to said base layer.

5. A method according to claim 4 further including the steps of pressing a pressure member against said covering and base layer prior to and during directing said laser light onto said covering and lifting said pressure member off of said covering after solidification of the welded location between said covering and said base layer, but prior to the solidification of the solder metal between the covering and the pressure member.

* * * * *